(12) United States Patent
Potluri

(10) Patent No.: US 9,780,790 B2
(45) Date of Patent: Oct. 3, 2017

(54) HIGH SPEED LEVEL SHIFTER CIRCUIT

(71) Applicant: Microsemi SoC Corporation, San Jose, CA (US)

(72) Inventor: Krishna Chaitanya Potluri, Hyderabad (IN)

(73) Assignee: MICROSEMI SOC CORPORATION, Pasadena, CA (US)

( * ) Notice: Subject to any disclaimer, the term of this patent is extended or adjusted under 35 U.S.C. 154(b) by 0 days.

(21) Appl. No.: 15/043,670

(22) Filed: Feb. 15, 2016

(65) Prior Publication Data

US 2016/0241243 A1      Aug. 18, 2016

(30) Foreign Application Priority Data

Feb. 18, 2015   (IN) .......................... 517/MUM/2015

(51) Int. Cl.
*H03K 19/177*      (2006.01)
*H03K 19/0185*    (2006.01)
*H03K 19/173*      (2006.01)

(52) U.S. Cl.
CPC . *H03K 19/018521* (2013.01); *H03K 19/0185* (2013.01); *H03K 19/1733* (2013.01); *H03K 19/17744* (2013.01)

(58) Field of Classification Search
CPC ..... H03K 19/017509; H03K 19/01806; H03K 19/018507; H03K 19/0152; H03K 19/018571; H03K 19/0013; H03K 19/018514; H03K 19/018528; H03K 3/35613; H03K 3/356156; H03K 19/17744; H03K 19/1733; H03K 19/0185; H03K 3/35625
See application file for complete search history.

(56) References Cited

U.S. PATENT DOCUMENTS 6,043,699 A *   3/2000   Shimizu ........... H03K 3/356113
                                                                    326/80
7,808,294 B1 * 10/2010  Kottapalli ........ H03K 3/356113
                                                                    326/68
7,902,870 B1     3/2011   Jiang
(Continued)

OTHER PUBLICATIONS

Kyoung-Hoi Koo et al., "A New Level-Up Shifter for High Speed and Wide Range Interface in Ultra Deep Sub-Micron", IEEE 0/7803-8834, Aug. 2005, pp. 1063-1065.
(Continued)

*Primary Examiner* — Vibol Tan
(74) *Attorney, Agent, or Firm* — Cislo & Thomas, LLP

(57) ABSTRACT

A r a level shifter circuit includes a first p-channel kick transistor connected directly across a first cross-coupled p-channel transistor, a second p-channel kick transistor connected directly across a second cross-coupled p-channel transistor, a first gate drive circuit coupled to the gate of the first p-channel kick transistor and configured to turn on first p-channel kick transistor to pull up the first output node in response to a rising edge of a signal at the input node, and a second gate drive circuit coupled to the gate of the second p-channel kick transistor and configured to turn on second p-channel kick transistor to pull up the second output node in response to a falling edge of a signal at the input node.

5 Claims, 3 Drawing Sheets

(56) References Cited

U.S. PATENT DOCUMENTS

| | | | | |
|---|---|---|---|---|
| 8,102,199 | B2* | 1/2012 | Chou | H03K 3/356113 |
| | | | | 326/68 |
| 8,115,514 | B2* | 2/2012 | Deng | H03K 3/356113 |
| | | | | 326/68 |
| 8,400,206 | B2 | 3/2013 | Benzer | |
| 8,421,518 | B2 | 4/2013 | Larsen | |
| 8,593,204 | B2 | 11/2013 | Tobita | |
| 8,669,803 | B2 | 3/2014 | Huang et al. | |
| 9,054,694 | B2* | 6/2015 | Zhou | H03K 19/017509 |
| 2003/0201800 | A1* | 10/2003 | Matsuo | H03M 9/00 |
| | | | | 327/57 |
| 2003/0234678 | A1* | 12/2003 | Cleary | H03K 3/356165 |
| | | | | 327/333 |
| 2010/0214000 | A1 | 8/2010 | Crespi et al. | |
| 2012/0112790 | A1* | 5/2012 | Huang | H03K 3/356182 |
| | | | | 326/81 |
| 2013/0321027 | A1* | 12/2013 | Zhou | H03K 19/017509 |
| | | | | 326/81 |

OTHER PUBLICATIONS

Bert Serneels et al., "A High speed, Low Voltage to High Voltage Level Shifter in Standard 1.2V 0.13μm CMOS", IEEE 1-4244-0395, Feb. 2006, pp. 668-671.
Yashodhan Moghe et al., "Nanosecond Delay Floating High Voltage Level Shifters in a 0.35 ?m HV-CMOS Technology", IEEE Journal of Solid-State Circuits, vol. 46, No. 2, Feb. 2011, pp. 485-497.

* cited by examiner

HIGH SPEED LEVEL SHIFTER CIRCUIT

CROSS-REFERENCE TO RELATED APPLICATIONS

This application claims priority from Indian Patent Application No. 517/MUM/2015, filed Feb. 18, 2015, the contents of which are incorporated in this disclosure by reference in their entirety.

BACKGROUND

The present invention relates to level shifter circuits, and in particular to level shifter circuits having increased switching speed.

The feature size of transistors in CMOS technology continues to shrink as technology advances. As a result, the core supply voltage of integrated circuits also drops. For example, when feature sizes shrink from 0.15 nm technology to 90 nm technology the core supply voltage drops to 0.9V from 1.5V. However, when interfacing the integrated circuit with external components, in many cases it needs to be compatible with older technologies having a 3.3V supply. Therefore, a level shifter circuit is required to convert the signals in from the core supply level to the IO supply level in order to communicate with outside components.

The class of integrated circuits that includes user-programmable integrated circuits such as field programmable gate array (FPGA) integrated circuits generally includes two types of transistors. Transistors having 50 Angstrom thick gate oxide layers are slow due to their relatively thick gate oxide layers, but can sustain 3.6V. These devices are used to build logic circuits to work with 1.8V, 2.5V, and 3.6V power supplies. Transistors having 20-Angstrom thick gate oxide layers are fast due to their relatively thin gate oxide layers, but can sustain only 1V power supplies. These devices are used to build logic circuits in the core of FPGA.

FPGA integrated circuits usually employ general-purpose input/output (GPIO) circuits targeted for high voltage standards like LVCMOS33/25 PCI. The maximum voltage is 3.6 v. The 2.5V device can withstand 3.6 v by increasing its length proportionately. A conventional level shifter circuit can fulfill the task of converting a 1.5V signal to a 3.3V signal. However, in 90 nm technology or other technologies that provide a very low core supply voltage, present level shifter circuits can only handle relatively low speed signals.

This problem in the prior art is most acute when the integrated circuit must drive an external component such as DDR3/4 memory. For example, DDR3 memory has a minimum speed requirement of 300 MHz.

Previous generation GPIO circuits do not have DDR3 capability. A current challenge in GPIO circuits is the internal block design (level shifter/pre-driver) is to be able to use extra length 2.5 v thick oxide transistors for reliability and still make DDR3 speeds.

Current GPIO circuits are speed restricted due to usage of these extra-long thick oxide devices (need to tolerate up to 3.6 v) in its logic. Advanced techniques are needed to improve the speed and performance at DDR3/4 speeds.

Therefore, there is a need for a new method for a level shifter circuit that overcomes the disadvantages of the prior art and fulfills the need to provide drive for external DDR circuits.

SUMMARY

According to one embodiment of the present invention, a speed improvement circuit is provided for a level shifter circuit having an input node converting an internal voltage in an integrated circuit to a higher external voltage for driving devices external to the integrated circuit and including first and second cross-coupled p-channel transistors having a first gate oxide thickness to withstand the external voltage and coupled to complementary output nodes. The speed improvement circuit includes a first p-channel kick transistor connected directly across the first cross-coupled p-channel transistor, a second p-channel kick transistor connected directly across the second cross-coupled p-channel transistor, a first gate drive circuit coupled to the gate of the first p-channel kick transistor and configured to turn on first p-channel kick transistor to pull up the first output node in response to a rising edge of a signal at the input node, and a second gate drive circuit coupled to the gate of the second p-channel kick transistor and configured to turn on second p-channel kick transistor to pull up the second output node in response to a falling edge of a signal at the input node.

DRAWINGS

These and other features, aspects and advantages of the present invention will become better understood with regard to the following description, appended claims, and accompanying drawings where:

DESCRIPTION

Persons of ordinary skill in the art will realize that the following description of the present invention is illustrative only and not in any way limiting. Other embodiments of the invention will readily suggest themselves to such skilled persons.

Figure 1A:
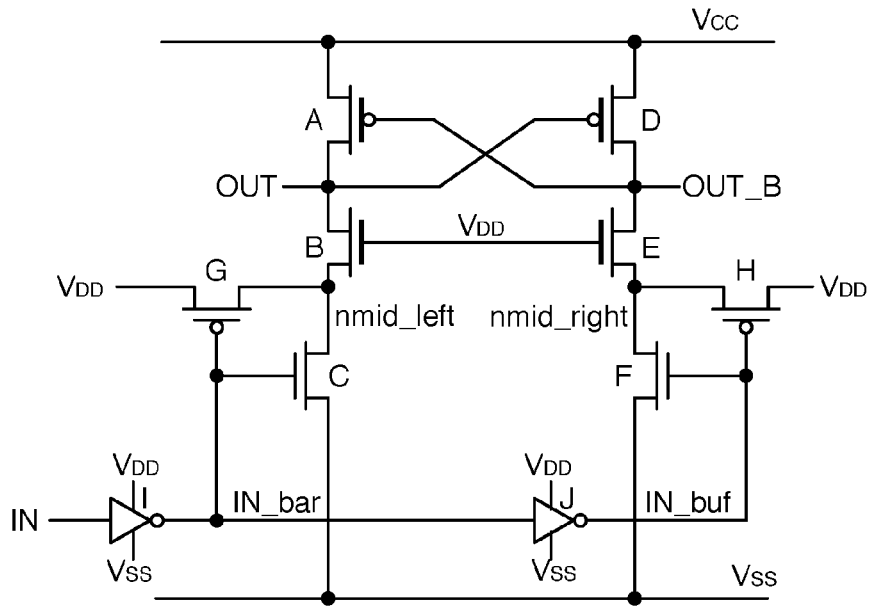
FIG. 1A is a schematic diagram of a representative prior-art level shifter circuit.
Figure 1B:
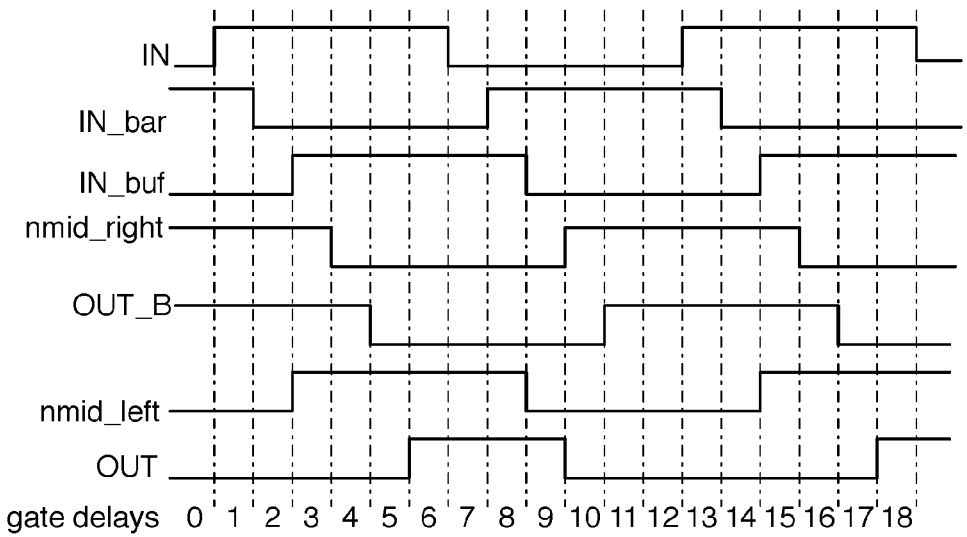
FIG. 1B is a timing diagram showing the operation of the level-shifter circuit of FIG. 1A.

Referring now to FIGS. 1A and 1B, a prior-art level-shifter circuit is shown along with a timing diagram illustrating its operation. An input signal on the input terminal IN is presented to an inverter I to produce a complementary signal IN_bar. A second inverter J cascaded with inverter I produces the signal IN_buf having the same polarity as the signal at the IN terminal. The two inverters I and J are in the in the $V_{DD}$ domain ($V_{DD}$=1V).

Two stacked transistor arrangements include a left-side p-channel transistor A in series with two left-side n-channel transistors B and C and a right-side p-channel transistor D in series with two right-side n-channel transistors E and F. A p-channel transistor G is connected between a node nmid_left and $V_{DD}$, its gate being connected to the gate of the lower left-side n-channel transistor C and to the node IN_bar. The node nmid_left is defined by the connection of the source of n-channel transistor B to the drain of n-channel transistor C. Similarly, a p-channel transistor H is connected between a node nmid_right and $V_{DD}$, its gate being connected to the gate of the lower right-side n-channel transistor F and to the node IN_buf. The node nmid_right is defined by the connection of the source of n-channel transistor E to the drain of n-channel transistor F. The sources of the left-side and right side p-channel transistors A and D are connected to $V_{CC}$ ($V_{CC}$=2.5V-3.3V).

As indicated by the thicker lines representing the gates of the p-channel transistors A and D and the upper n-channel transistors B and E in both stacks, the gate oxide layers of these transistors in both stacks are thicker than the gate oxide layers of the remaining transistors in the circuit because they must withstand the higher voltages present in the $V_{CC}$ domain, while the other transistors in the circuit (including the ones in the inverters) only need to withstand the voltages present in the $V_{DD}$ domain.

The timing diagram of FIG. 1B illustrates the circuit delay from a rising edge signal on the input terminal IN. Initially the left side p-channel transistor A is turned off and the right side p-channel transistor D is turned on. As may be seen from FIG. 1B, by virtue of passing through the first inverter I the signal at the node IN_bar is delayed from the signal at the input terminal IN and by virtue of passing through the second inverter J the signal at the node IN_buf is delayed from the signal at the node IN_bar.

The rising edge of the signal at node nmid_left is similarly delayed from the falling edge of the signal at the node IN_bar, since nmid_left is switched to a high level by p-channel transistor G turning on in response to a low level of signal at node IN_bar. The falling edge of the signal at node nmid_right is delayed from the rising edge of the signal at node IN_buf, since the falling edge of the signal at node nmid_right is caused by n-channel transistor F turning on, and p-channel transistor H turning off in response to the high level of the signal at node IN_buf. The falling edge of the signal at node OUT_B is delayed from the rising edge of the signal at node IN_buf since the falling of the signal at node nmid_right causes n-channel transistor E to turn on, which thus pulls down the signal at terminal OUT_B. N-channel transistor E is sized such that it can pull down the node OUT_B and can turn on the left side p-channel transistor A irrespective of the on-state of p-channel transistor D. The rising edge of the signal at node OUT is delayed from the falling of the signal at node OUT_B, since once the left side p-channel transistor A is turned on, node OUT is pulled up to $V_{CC}$ and this turns off transistor D, thus locking the circuit.

When a falling edge signal is now received at node IN, by virtue of passing through the first inverter I the rising edge of the signal at the node IN_bar is delayed from the signal at the input terminal IN and by virtue of passing through the second inverter J the falling edge of the signal at the node IN_buf is delayed from the rising edge of the signal at the terminal IN_bar.

The falling edge of the signal at node nmid_left is similarly delayed from the rising edge of the signal at the node IN_bar, since nmid_left is switched to a low level by p-channel transistor G turning off in response to a high level of signal at node IN_bar. The falling edge of node OUT is delayed from the falling edge of the signal at node nmid_left, since the falling edge of the signal at node nmid_left turns on left side n-channel transistor B, which is sized such that it can pull down the node OUT and can turn off the right side p-channel transistor D irrespective of the on-state of left side p-channel transistor A.

The rising edge of the signal at node nmid_right is delayed from the falling edge of the signal at node IN_buf, since the rising edge of the signal at node nmid_right is caused by n-channel transistor F turning off, and p-channel transistor H turning on in response to the low level of the signal at node IN_buf. The rising edge of the signal at node OUT_B is delayed from the rising edge of the signal at node nmid_right since the rising of the signal at node nmid_right causes right side n-channel transistor E to turn off, and as described above since right side p-channel transistor D is on, right side p-channel transistor D pulls up the signal at terminal OUT_B, thus locking the circuit.

As a result of the loop delays in the circuit of FIG. 1A the rising edge of OUT is delayed by five gate delays but its falling edge is delayed by three gate delays. As a result, the OUT signal spends less time at logic one and more time at logic zero as shown in FIG. 1B. This delay mismatch between the rising edge and falling edge distorts the duty cycle of the signal away from the ideal value of 50% and can be as bad as 30%. This means the OUT signal spends 70% of the time at logic 0 and 30% of the time at logic 1. As signaling speeds continue to increase in new signaling standards, the gate delays are almost close to the bit times, the specifications are very stringent and duty cycle distortion needs to be restricted to within 45% to 50%.

Figure 2A:
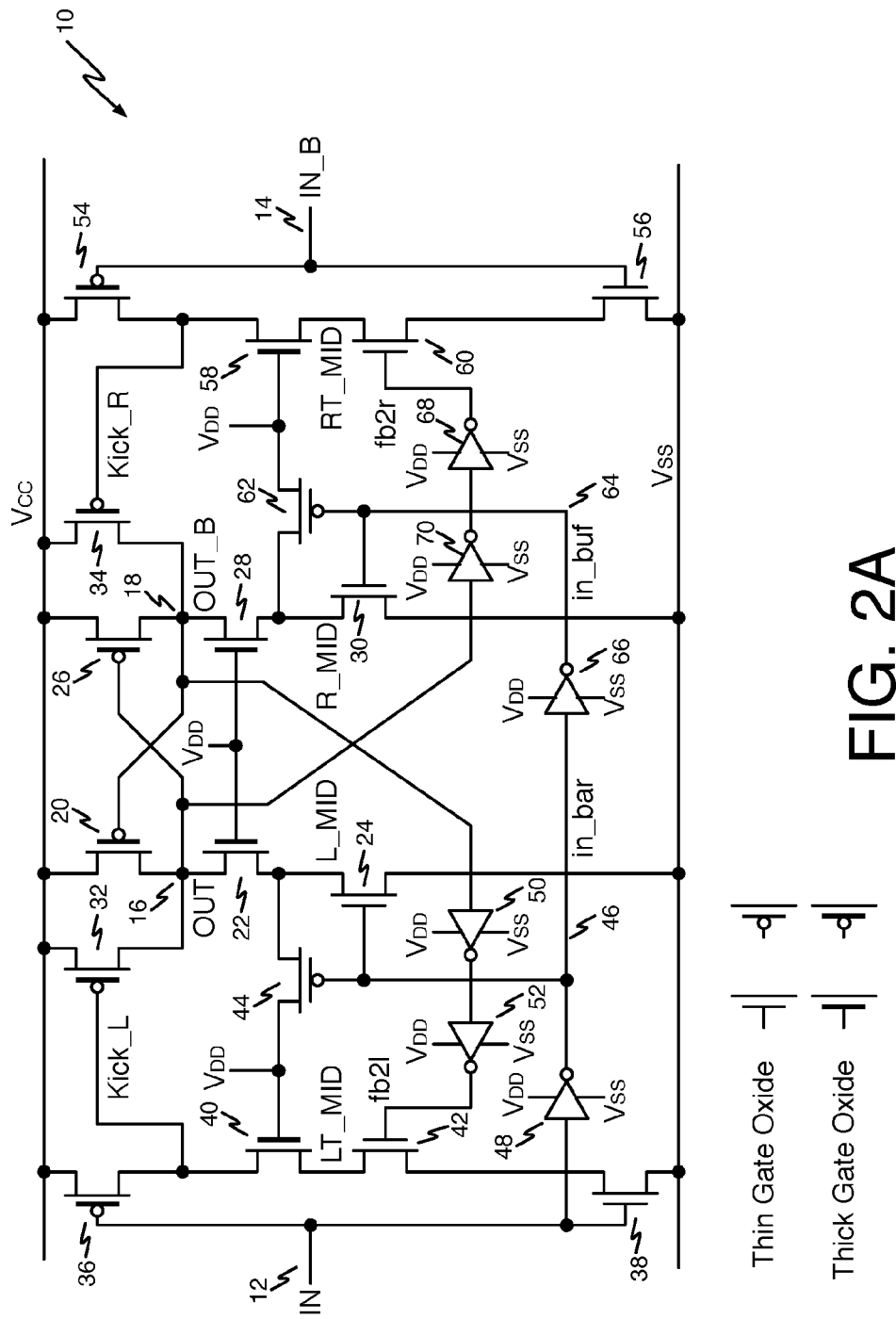
FIG. 2A is a schematic diagram of a level-shifter circuit in accordance with one aspect of the present invention.
Figure 2B:
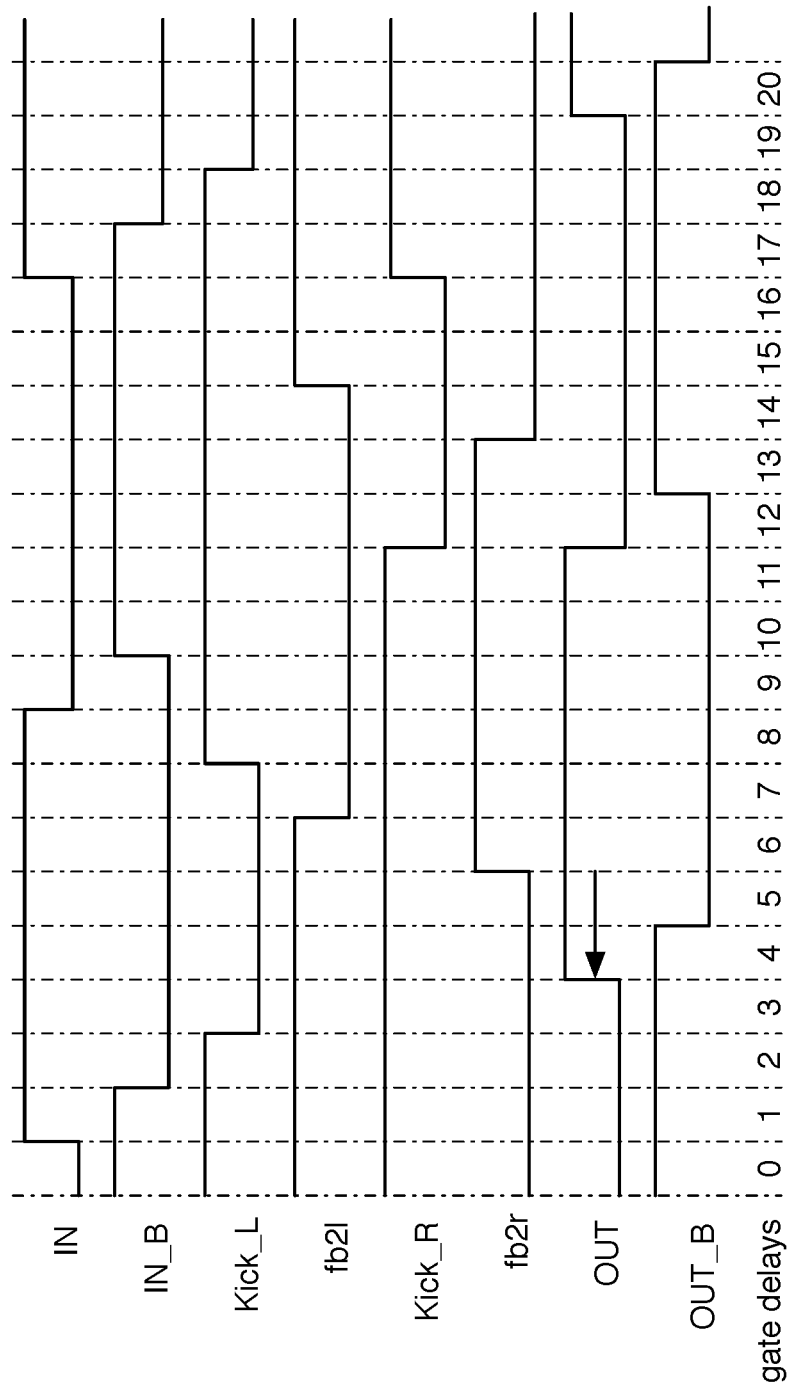
FIG. 2B is a timing diagram showing the operation of the level-shifter circuit of FIG. 2A.

Referring now to FIGS. 2A and 2B an illustrative embodiment of the present invention and its operation are shown. As in the prior-art level shifter circuit of FIG. 1A, level-shifter circuit 10 of the present invention includes two types of transistors, differentiated by the thickness of their gate oxides and their resulting higher breakdown voltages. The transistors having higher breakdown voltages are designated by having thicker lines representing their gates.

A level shifter circuit 10 in accordance with the present invention includes complementary input nodes IN (reference numeral 12) and IN_B (reference numeral 14) and complementary output nodes OUT (reference numeral 16) and OUT_B (reference numeral 18). Input nodes at 12 and 14 are in the $V_{DD}$ domain (nominally 1V) and output nodes at 16 and 18 are in the $V_{CC}$ domain (nominally 2.5-3.3V). It is to be understood that input IN_B 14 may be generated by an inverter from a signal appearing at input node IN 12, as described above.

Like the level-shifter circuit of FIG. 1A, level shifter circuit 10 includes two transistor stacks. A left side transistor stack includes thick-oxide p-channel transistor 20 connected in series with thick-oxide n-channel transistor 22 and n-channel transistor 24 between $V_{CC}$ and $V_{SS}$ (ground). A right side transistor stack includes thick-oxide p-channel transistor 26 connected in series with thick-oxide n-channel transistor 28 and n-channel transistor 30 between $V_{CC}$ and $V_{SS}$. The gate of p-channel transistor 20 is cross coupled to the common drain connections of p-channel transistor 26 and n-channel transistor 28 and denoted node OUT_B 18. The gate of p-channel transistor 26 is cross coupled to the common drain connections of p-channel transistor 20 and n-channel transistor 22 and denoted node OUT 16.

A Kick_L thick-oxide p-channel transistor 32 is connected across p-channel transistor 20 and a Kick_R thick-oxide p-channel transistor 34 is connected across p-channel transistor 26.

Input node IN 12 is connected to the gates of a p-channel transistor 36 and an n-channel transistor 38. A thick-oxide n-channel transistor 40 connected in series with an n-channel transistor 42 is connected between the drains of p-channel transistor 36 and n-channel transistor 38. The gate of Kick_L thick oxide p-channel transistor 32 is connected to the common drain connections of p-channel transistor 36 and thick oxide n-channel transistor 40. A p-channel transistor 44 is connected between the gate of n-channel transistor 40 and the source of n-channel transistor 22. The source of p-channel transistor 44 (as well as the gate of n-channel transistor 40) is further connected to $V_{DD}$ and its gate is connected to the gate of n-channel transistor 24 and to a node in_bar 46 at the output of an inverter 48 having an input connected to input node IN 12. Inverter 48 is powered by $V_{DD}$. The gate of n-channel transistor 42 is connected to the common drain connection of thick oxide p-channel transistor 26 and thick oxide n-channel transistor 28 at output node OUT_B 18 through cascaded inverters 50 and 52. Both inverters 50 and 52 are powered by $V_{DD}$.

Input node IN_B 14 is connected to the gates of p-channel transistor 54 and n-channel transistor 56. A thick-oxide n-channel transistor 58 connected in series with an n-channel transistor 60 is connected between the drains of p-channel transistor 54 and n-channel transistor 56. The gate of Kick_R thick oxide p-channel transistor 34 is connected to the common drain connections of p-channel transistor 54 and thick oxide n-channel transistor 58. A p-channel transistor 62 is connected between the gate of thick oxide n-channel transistor 58 and the source of thick oxide n-channel transistor 28. The source of p-channel transistor 62 (as well as the gate of n-channel transistor 58) is further connected to $V_{DD}$ and its gate is connected to the gate of n-channel transistor 30 and to a node in_buf 64 at the output of an inverter 66 having an input connected to in_bar node 46. Inverter 66 is powered by $V_{DD}$. The gate of n-channel transistor 60 is connected to the common drain connection of thick oxide p-channel transistor 20 and thick oxide n-channel transistor 22 at node OUT 16 through cascaded inverters 68 and 70. Both inverters 68 and 70 are powered by $V_{DD}$.

The invention uses the prior art level shifter circuit of FIG. 1A as a core level shifting element, but advantageously provides for an active trigger circuit to correct the delay mismatch observed between rising and falling edges. It advances the occurrence of the rising edge by two gate delays and will match the rising edge delay with the falling edge delay. This will ensure the output signal spends equal time at logic high and logic low, which results in a duty cycle of almost 50%.

FIG. 2B is a timing diagram showing the operation of the level shifter circuit 10 of FIG. 2A. Level shifter circuit 10 is well understood when it is analyzed during a static state and while transitioning between states. The description below will analyze the operation of level shifter circuit 10 starting with a logic 0 state at input node IN 12, while input node IN 12 transitions from logic 0 to logic 1 state, input node IN 12 at logic 1 state and while input node IN 12 transitions from logic 1 to logic 0 states. This completes a cycle of operation.

Starting with initial state of input node IN 12 at logic 0 (0V) and IN_B 14 at logic 1 (1V), the thick gate p-channel transistor 36 is on and thin gate n-channel transistor 38 is off. Irrespective of the state of thick gate n-channel transistor 40 and thin gate n-channel transistor 42, node KICK_L will therefore be at Vcc (2.3-3.3V), which will thus turn off thick gate p-channel transistor 32. Inverter 48, whose input is at 0V presented by IN 12 will drive its node in_bar 46 at the output of inverter 48 to logic 1 (1V), which will turn on thin gate n-channel transistor device 24, turn off thin gate p-channel transistor 44, and present logic 1 (1V) to inverter 66. Thick gate n-channel transistor 22 whose gate is always connected to $V_{DD}$ (1V) is also turned on. A logic 1 (1V) on the input of inverter 66 will drive its output node in_buf 64 to logic 0 (0V) and will turn off thin gate n-channel transistor 30. As a result when node IN 12 is at logic low, output node OUT 16 will be pulled towards logic low (0V), since as indicated above thick gate n-channel transistor 22 and thin gate n-channel transistor 24 are both on. As output node OUT 16 falls towards 0V, thick oxide p-channel transistor 26 will be turned on and as a result output node OUT_B 18 attains value of logic 1 (2.5-3.3V) and turns off thick gate p-channel transistor 20. Output node OUT_B 18 also presents logic 1 (2.5-3.3V) on gate of $V_{DD}$ powered inverter 50, which will present a logic 0 (0V) at the input of $V_{DD}$ powered inverter 52. This will result as logic 1 (1V) at node fb2l on the gate of thin gate n-channel transistor 42. Node IN_B 14 of a logic 1 (1V) is generated by inversion of node IN 12 (0V), which turns on thin gate n-channel transistor 56 but does not turn off thick gate p-channel transistor 54 since the source of thick gate transistor 54 is at 2.5-3.3V. Thick gate p-channel transistor 54 therefore pulls node KICK_R to logic 1 (2.5-3.3 v). Even though thick gate p-channel transistor 54 is not turned off, it will not sink current from $V_{CC}$ to $V_{SS}$ as thin gate n-channel transistor 60 is off since its gate is driven to logic 0 (0V) responsive to the logic 0 (0V) on node OUT 16 and the operation of inverters 70, 68. FIG. 2B shows initial node states when IN 12 node is at logic 0 (0V) at gate delay 0.

When a transition from logic 0 to logic 1 happens on node IN 12, as shown at the end of gate delay 0, thick gate p-channel transistor 36 will be weakened due to the increase (0V to 1V) of its gate voltage and thin gate n-channel transistor 38 is turned on. While node fb2l at logic 1 (1V) from its previous state is still maintained, the thick gate n-channel transistor 40 whose gate is connected $V_{DD}$ is not on until its source voltage drops at least one $V_{th}$ less than its gate voltage of $V_{DD}$. Thick gate n-channel transistor 40 takes one gate delay to turn on. N-channel transistors 40, 42 and 38 are sized to overpower thick oxide p-channel transistor 36 (already weakened by a logic 1 (1V) on its gate) and so the node KICK_L will be pulled down close to 0V after two gate delays. In particular, during the first gate delay node LT_MID is pulled down to 0 responsive to the turn on of thin gate n-channel transistor 38 and the second gate delay is needed to turn on thick gate n-channel transistor 40 to pull down node KICK_L. As node KICK_L approaches 0V, thick gate p-channel transistor 32 turns on and starts pulling node OUT 16 towards $V_{CC}$. The above action of output node OUT 16 reaching $V_{CC}$ is achieved with one gate delay from KICK_L node reaching logic 0 (0V), a total of three gate delays from the initial transition seen at node IN 12. As output node OUT 16 rises towards Vcc, thick gate p-channel transistor 26 is turned off after an additional gate delay, and thin gate n-channel transistor 60 is turned on responsive to inverters 70, 68 after two gate delays from the rising transition of the output node OUT 16.

In parallel with this action, a logic 0 to logic 1 transition on node IN 12 will appear on node in_buf 64 after two gate delays to turn on thin gate n-channel transistor 30. The turn on of thin gate n-channel transistor 30 pulls down the source of thick gate n-channel transistor 28 whose gate is at $V_{DD}$ thus turning it on after three gate delays from the transition at node IN 12. The logic 0 to logic 1 transition on node IN 12 will appear on node IN_B 14 after one gate delay as a transition from logic 1 to logic 0, fully turning on thick gate p-channel transistor 54. Fully turning on thick gate p-channel transistor 54 pulls up node Kick_R after an additional gate delay, thereby shutting off thick gate p-channel transistor 34 after three gate delays from the initial transition. This combination of turning on of thick gate n-channel transistor 28, thin gate n-channel transistor 30 and turning off of thick gate p-channel transistors 26 and 34, will drive output node OUT_B 18 to logic 0 (0V) in four gate delays after the initial logic 0 to logic 1 transition occurs at input node IN 12. Output node OUT_B 18 at logic 0 (0V) will turn on thick gate p-channel transistor 20 and holds the output node OUT 16 at logic 1 (2.5-3.3V). Note that the transition from logic 0 (0V) to logic 1 (2.5-3.3V) of output node OUT 16 is not dependent on the positive feedback loop created by thick gate p-channel transistors 20 and 26, but is only maintained by that loop. At this point the level shifter circuit 10 has changed its state. This means that the output nodes OUT and OUT_B 16 and 18 are well set in their new states of logic 1 (2.5-3.3V) and logic 0 (0V) in three and four gate delays from gate delay 0, i.e. the initial transition, respectively. The node fb2r will realize a logic 1 (1V) in two gate delays from the transition of output node OUT 16 from logic 0 (0V) to logic 1 (2.5-3.3V), due to the two delays through $V_{DD}$ powered inverters 68 and 70, as described above. The node fb2l will realize a logic 0 (0V) in two gate delays from the transition of output node OUT_B 18 from logic 1 (2.5-3.3V) to logic 0 (1V), due to the two delays through $V_{DD}$ powered inverters 50 and 52, as shown at gate delay 6 in FIG. 2B. Node fb2l at logic 0 (0V) will turn off thin gate n-channel transistor 42 which disables the pull down path through n-channel transistors 40, 42, and 38 and enables weakly on thick gate p-channel transistor 36 to pull up the KICK_L node to $V_{CC}$ (2.5-3.3V) in one gate delay from the fb2l logic transition, as shown at gate delay 7 of FIG. 2B, which as described above turns off thick gate p-channel transistor 32.

When a transition from logic 1 (1V) to logic 0 (0V) happens on node IN 12, as shown at gate delay 8 of FIG. 2B, which is not a function of a gate delay but is rather an indication of a minimal timing for proper operation, thick gate p-channel transistor 36 is turned on and thin gate n-channel transistor 38 is turned off. Irrespective of the state of thick gate n-channel transistor 40 and thin n-channel gate transistor 42, node KICK_L will be maintained at value of $V_{CC}$ (2.3-3.3V) due to the operation of thick gate p-channel transistor 36. This will not alter the state of thick gate p-channel transistor 32 which is off, as described above in relation to gate delay 7 of FIG. 2B. Inverter 48 responds to the transition on node IN 12 and drives its output at node in_bar 46 to logic 1 (1V), which turns off thin gate p-channel transistor 44 and turns on thin gate n-channel transistor 24 through which node L_MID node, common to n-channel transistors 22 and 24, is pulled to logic 0. This is achieved in two gate delays after the input IN 12 transition from logic 1 to logic 0, i.e. after gate delay 10 of FIG. 2B. While the node L_MID falls towards logic 0, the thick gate n-channel transistor 22 which has its gate connected to $V_{DD}$ and drain at about $V_{CC}$ will consume one gate delay to turn on and pull down output node OUT 16 to logic 0 (0V), i.e. at gate delay 11 of FIG. 2B. Output node OUT 16 thus reaches a logic low state within three gate delays after a logic 1 to logic 0 transition on input node IN 12. N-channel transistors 22, 24 are sized to overpower p-channel transistor 20 when on to pull down output node OUT 16 irrespective of the on state of p-channel transistor 20. This achieves the delay equalization (3 gate delays) on both rising and falling edges of the signal at node OUT 16 in relation to the signal at node IN 12 and maintains a duty cycle of 50%. This timing cycle repeats as shown in FIG. 4B.

The transition at node IN 12 from logic 1 to logic 0 at gate delay 8 of FIG. 2B propagates to node IN_B 14 at gate delay 9 as a transition from logic 0 to logic 1, which transitions thick gate p-channel transistor 54 from fully on to weakly on and turns on n-channel transistor 56 at gate delay 10 of FIG. 2B. Since thin gate n-channel transistor 60 is still in the on state and thick gate n-channel transistor 58 is on, pulls down node Kick_R at gate delay 11 of FIG. 2B. The pull down of node Kick_R at gate delay 11 of FIG. 2B turns on thick gate p-channel transistor 34 which pulls up node OUT_B 18 at gate delay 12 of FIG. 2B. The transition from logic 1 to logic 0 of node OUT 16 at gate delay 11 of FIG. 2B propagates through inverters 70, 68 to node fb2r at gate delay 13. The transition from logic 0 to logic 1 of node OUT_B 18 at gate delay 12 of FIG. 2B propagates through inverters 50, 52 to node fb2l at gate delay 14 of FIG. 2B, thus completing the cycle.

N-channel transistors 24, 30, 42, and 60 are thin oxide devices that can only take a maximum of 1.1V across their terminals. Because of this, the voltage at the nodes LT_MID, L_MID, R_MID, and RT_MID should not exceed $V_{DD}$ (1.1V). When OUT, OUT_B, KICK_L and KICK_R nodes swing from 0V to 3.3V, nodes LT_MID, L_MID, R_MID, and RT_MID are clamped not to exceed $V_{DD}$ voltage. The voltage swing on these nodes is restricted to between 0V and $V_{DD}$ by n-channel transistors 22, 28, 40, and 58, which respectively clamp the voltages at the sources of n-channel transistors 24, 30, 42, and 60 to no higher than $V_{DD}$.

As previously noted, n-channel transistors 22, 28, 40 and 58 are thick gate oxide NMOS transistors. Generally any n-channel transistor will turn itself off when its source voltage reaches its gate voltage and will not allow its source voltage go any higher than its gate voltage. Using this feature of n-channel transistors, when node OUT 16 reaches $V_{CC}$, the node between n-channel transistor 22 and n-channel transistor 24 will only reach $V_{DD}$ (1 v) after which the n-channel transistor 22 is turned off because its gate and source are at the same voltage. This would cause the common terminals of the source of n-channel transistor 22 and the drain of n-channel transistor 24 to float, but p-channel transistor 44 ties this node to $V_{DD}$. Similarly, when node OUT_B 18 reaches $V_{CC}$, the node between the source of n-channel transistor 28 and the drain of n-channel transistor 30 will only reach $V_{DD}$ (1 v) after which the n-channel transistor 28 is turned off because its gate and source are at the same potential. This would cause the common node between the source of n-channel transistor 28 and the drain of n-channel transistor 30 to float, but p-channel transistor 44, which is turned on when the signal at node IN 12 is low, will hold this node at $V_{DD}$.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A level shifter circuit for shifting logic levels between logic signals in a first voltage supply domain at a first potential and logic signals in a second voltage supply domain at a second potential, the second potential being higher than the first potential, the level shifter circuit comprising;

first and second complementary input nodes for receiving complementary logic signals in the first voltage supply domain;

first and second complementary output nodes;

a first p-channel transistor in series with a first n-channel transistor coupled across the second potential, a common drain connection of the first p-channel transistor and the first re-channel transistor connected to the first output node, the first p-channel transistor and the first re-channel transistor having gate oxide thicknesses selected to withstand the second potential;

a second p-channel transistor in series with a second n-channel transistor coupled across the second potential, a common drain connection of the second p-channel transistor and the second n-channel transistor connected to the second output node, the second p-channel transistor and the second n-channel transistor having gate oxide thicknesses selected to withstand the second potential;

the first p-channel transistor having a gate coupled to the second output node and the second p-channel transistor having a gate coupled to the first output node;

a third n-channel transistor in series with the first n-channel transistor, the third re-channel transistor having a gate coupled to the first input node through a first inverter;

a fourth n-channel transistor in series with the second n-channel transistor, the fourth n-channel transistor having a gate coupled to the first input node through a second inverter in series with the first inverter;

a first kick transistor connected directly across the first p-channel transistor;

a second kick transistor connected directly across the second p-channel transistor;

a first gate drive circuit coupled to the gate of the first kick transistor and configured to turn on the first kick transistor to pull up the first output node in response to a rising edge of a signal at the first input node; and a second gate drive circuit coupled to the gate of the second kick transistor and configured to turn on the second kick transistor to pull up the second output node in response to a falling edge of a signal at the first input node.

2. The level shifter circuit of claim 1 wherein:

the first gate drive circuit is further configured to turn off the first p-channel kick transistor after the first output node is pulled up in response to a rising edge of a signal at the first input node; and the second gate drive circuit is further configured to turn off the second p-channel kick transistor after the second output node is pulled up in response to a falling edge of a signal at the first input node.

3. The level shifter circuit of claim 2 wherein;

the first gate drive circuit is configured to turn off the first p-channel kick transistor in response to a falling edge signal at the second output node; and the second gate drive circuit is configured to turn off the second p-channel kick transistor in response to a falling edge signal at the first output node.

4. The level shifter circuit of claim 1 wherein the first and second kick transistors are p-channel transistors.

5. The level shifter circuit of claim 2 wherein:

the first and second kick transistors have gate oxide thicknesses selected to withstand the second potential; and the third and fourth n-channel transistors have gate oxide thicknesses selected to withstand the first potential.

* * * * *